United States Patent
Cournoyer et al.

(10) Patent No.: US 11,843,130 B2
(45) Date of Patent: Dec. 12, 2023

(54) SYSTEMS AND METHODS OF BATTERY CELL MANUFACTURE

(71) Applicant: Rivian IP Holdings, LLC, Plymouth, MI (US)

(72) Inventors: Travis Cournoyer, Redondo Beach, CA (US); Emil Chao, Studio City, CA (US)

(73) Assignee: Rivian IP Holdings, LLC, Plymouth, MI (US)

(*) Notice: Subject to any disclaimer, the term of this patent is extended or adjusted under 35 U.S.C. 154(b) by 378 days.

(21) Appl. No.: 17/212,561

(22) Filed: Mar. 25, 2021

(65) Prior Publication Data

US 2022/0311102 A1  Sep. 29, 2022

(51) Int. Cl.

| B23K 31/00 | (2006.01) |
|---|---|
| H01M 50/516 | (2021.01) |
| H01M 50/566 | (2021.01) |
| G01R 31/382 | (2019.01) |
| H01M 10/42 | (2006.01) |
| H01M 50/204 | (2021.01) |
| B23K 31/12 | (2006.01) |

(52) U.S. Cl.
CPC ......... *H01M 50/516* (2021.01); *B23K 31/125* (2013.01); *G01R 31/382* (2019.01); *H01M 10/4285* (2013.01); *H01M 50/204* (2021.01); *H01M 50/566* (2021.01)

(58) Field of Classification Search
CPC .......... H01M 50/516; H01M 10/4285; H01M 50/204; H01M 50/566; H01M 50/507; H01M 10/0404; G01R 31/382; Y02P 70/50; B23K 26/03; B23K 26/21; B23K 31/125; B23K 2101/38
USPC ....................... 228/102–105, 8–12
See application file for complete search history.

(56) References Cited

U.S. PATENT DOCUMENTS

| 2019/0081294 A1* | 3/2019 | Capati ............... B60L 50/64 |
| 2019/0081308 A1* | 3/2019 | Capati ............ H01M 50/516 |
| 2019/0081309 A1* | 3/2019 | Capati ............ H01M 50/213 |
| 2022/0311102 A1* | 9/2022 | Cournoyer ....... H01M 10/4285 |
| 2023/0104232 A1* | 4/2023 | Bae ..................... B23K 20/10 |
| | | 356/634 |

FOREIGN PATENT DOCUMENTS

| CN | 205508948 U | * | 8/2016 | |
| CN | 108257730 A | * | 7/2018 | ............ B23K 37/00 |
| CN | 111403800 A | * | 7/2020 | |
| CN | 113102265 A | * | 7/2021 | ............ B07C 5/02 |
| CN | 213752778 U | * | 7/2021 | |
| CN | 216926605 U | * | 7/2022 | |

(Continued)

*Primary Examiner* — Kiley S Stoner
(74) *Attorney, Agent, or Firm* — Haley Guiliano LLP

(57) ABSTRACT

Methods and systems for welding contacts of a plurality of battery cells are provided. A method includes using a detector to perform a scan of the cell electrode contact area for each of the plurality of battery cells. Based upon the scan of each cell electrode contact area, a determination is made of whether one or more possible weld sites for each electrode contact area are viable for welding. In response to determining that one or more weld sites are viable, one or more of the viable weld sites are selected and a welder is used to weld at least one of the selected weld sites.

20 Claims, 7 Drawing Sheets

(56) References Cited

FOREIGN PATENT DOCUMENTS

| | | | | |
|---|---|---|---|---|
| CN | 217466707 U | * | 9/2022 | |
| CN | 115336081 A | * | 11/2022 | ............. B07C 5/362 |
| JP | 2005339925 A | * | 12/2005 | |
| KR | 20220090911 A | * | 6/2022 | |
| KR | 20220112465 A | * | 8/2022 | |
| KR | 20220157634 A | * | 11/2022 | |
| KR | 20220166723 A | * | 12/2022 | |
| KR | 20230021474 A | * | 2/2023 | |
| WO | WO-2020171426 A1 | * | 8/2020 | ....... G01R 19/16542 |
| WO | WO-2022225345 A1 | * | 10/2022 | |

\* cited by examiner

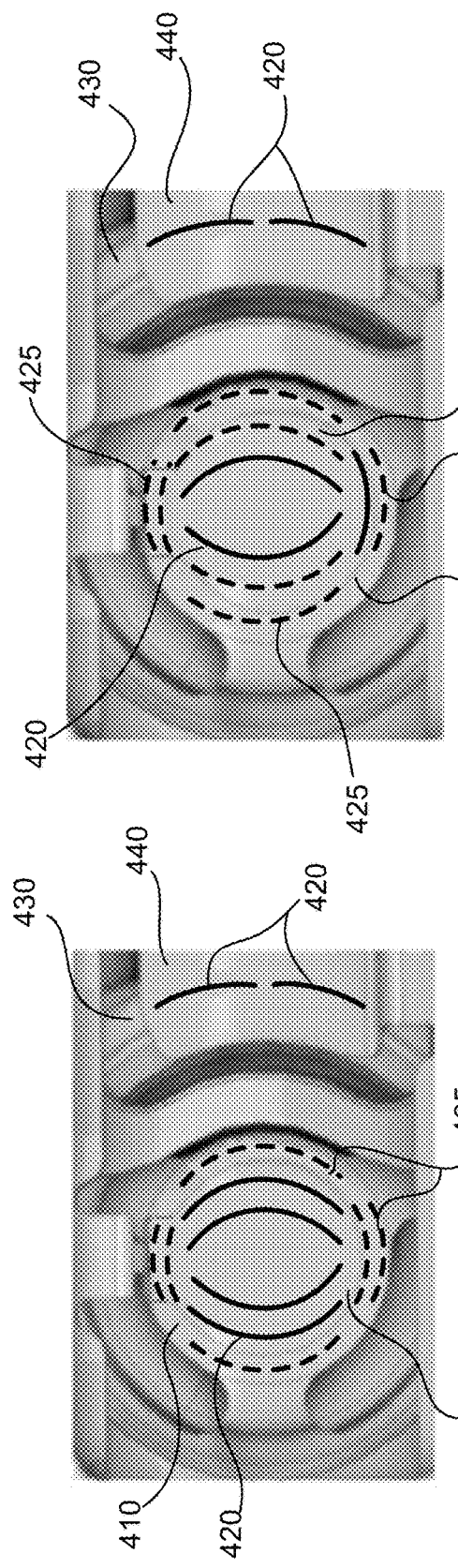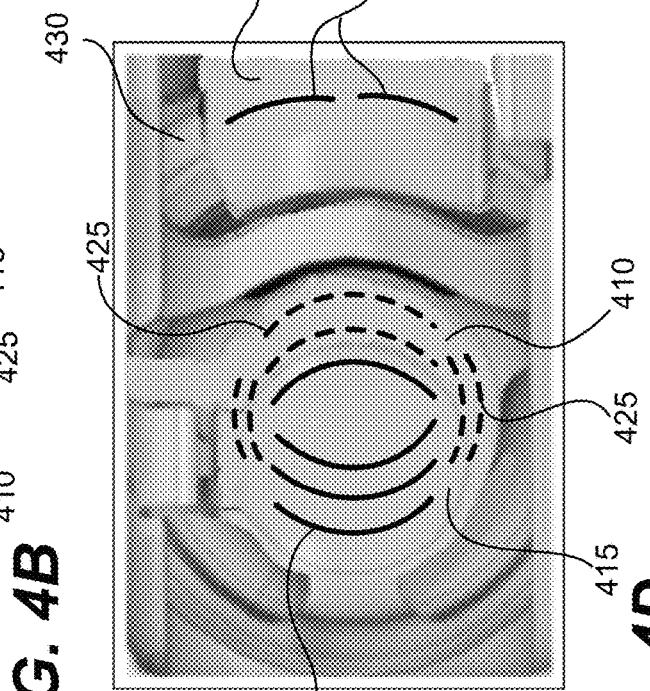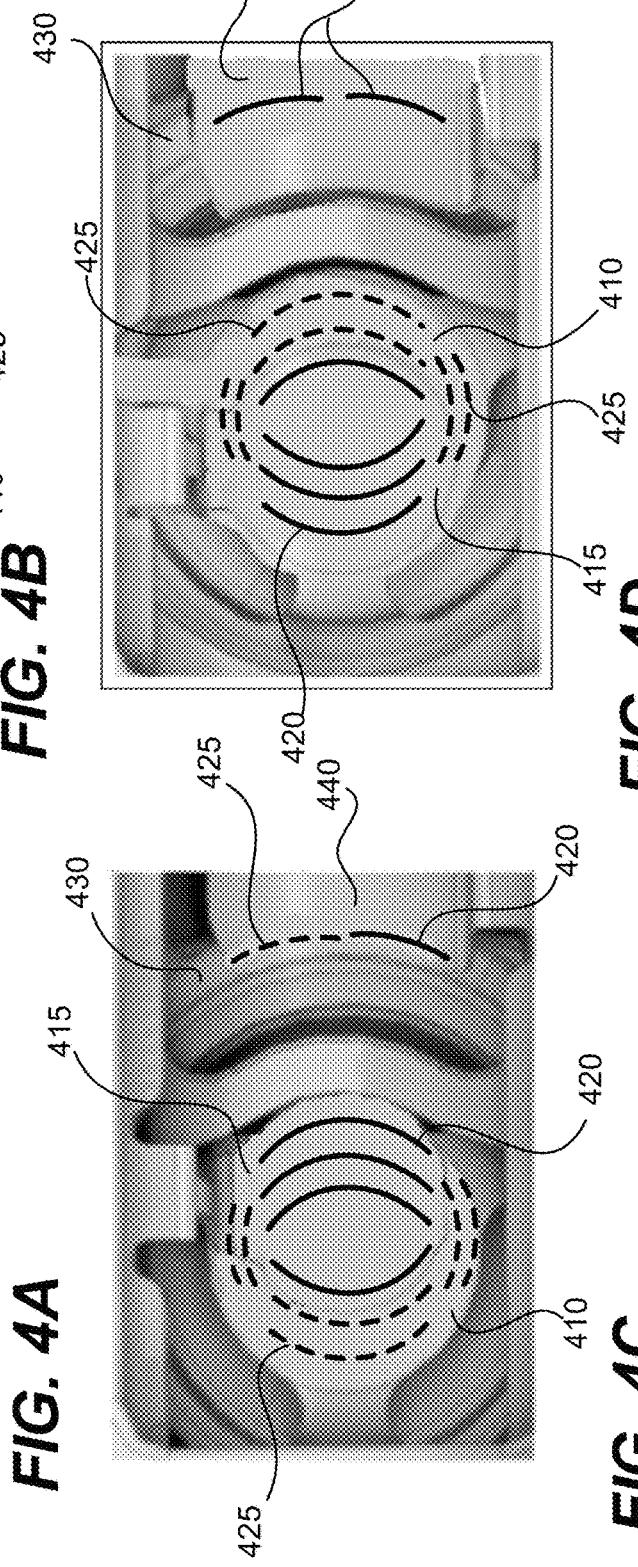

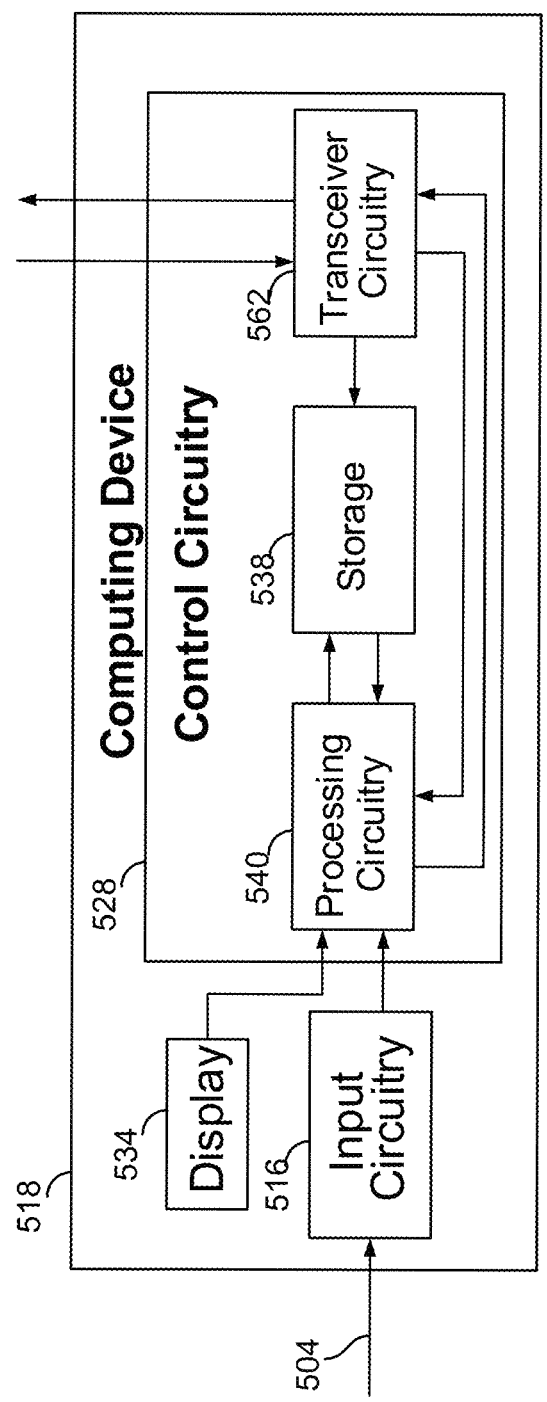
FIG. 5A
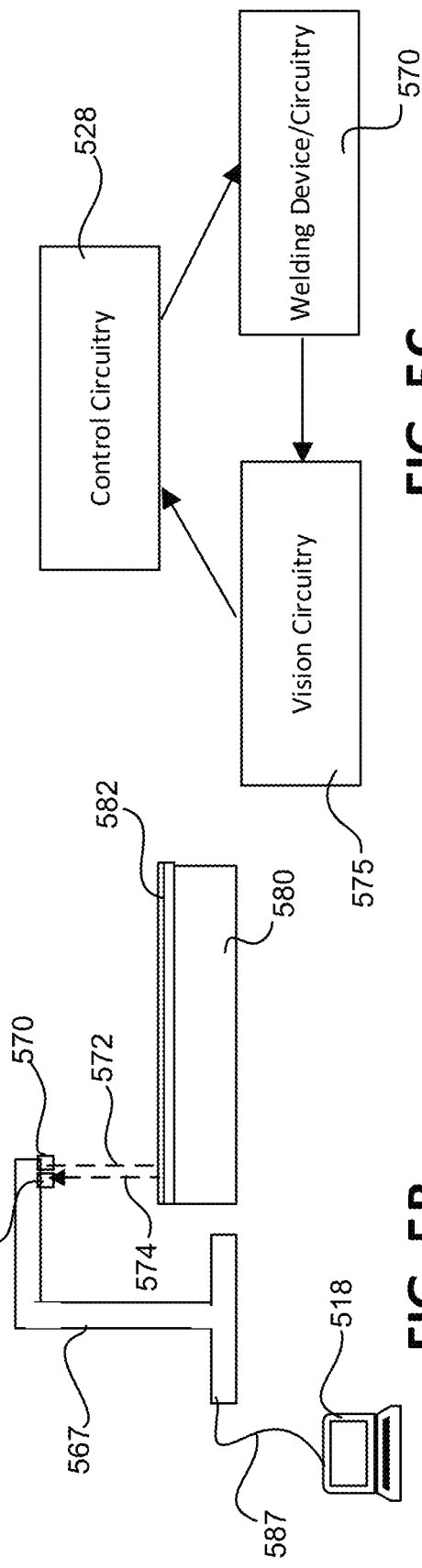
FIG. 5B
FIG. 5C the laser beam or result in a poor weld that will fail early in service. Thus, improved systems and methods for manufacturing and assembling large-sized battery cell arrays are provided by the embodiments described herein.

SYSTEMS AND METHODS OF BATTERY CELL MANUFACTURE

INTRODUCTION

The present disclosure relates to systems and methods of manufacturing and assembling battery cell arrays.

SUMMARY

Storing and harnessing significant levels of electrical energy is becoming more important as the uses of combustion-based sources of power are transitioned to renewable resources and other resources that are less polluting (e.g., wind, solar, nuclear). Storing energy for applications where there is a high current/voltage demand over extended periods of time (e.g., for powering large/heavy motorized vehicles) may use a large number of battery cells (e.g., thousands) within which to store the energy and an infrastructure for carrying the high levels of power to their destination.

As the demands on the efficiency and power of energy transfer systems increase, battery modules increase in size and so does their complexity and numbers of electrical connection points needed for the battery cells. It is important that the connections among the large number of battery cells allow for high-power surges and are consistently manufactured. A poor connection point may cause failures including, for example, deficient power transfer and short circuits. A lack of consistency among connections may also lead to overly variable impedance and imbalance within pluralities of cells connected in parallel, causing a loss of energy from the resulting heat generated by the impedances and a diminished overall battery pack energy capacity.

Such failures and reduced energy capacity will directly impact the performance of the devices that the batteries power. The impact may be significantly detrimental where high energy efficiency and power are important for the control and long-term durability and reliability of the powered device (e.g., a battery-powered vehicle). Thus, maintaining the robustness and consistency of connection points can be a critical factor in the manufacture of large arrays of battery cells. At the same time, as the number of battery cells increase, it becomes more difficult and complex to maintain consistent alignment and electrical connections between the array's numerous electrical contact points and terminals.

One type of manufacturing process includes assembling "stackable" components together with particular alignment features (e.g., indents, tabs, physical locking features). Controlling the variation in alignment of the components and connecting them electrically can become more difficult as the array of components increases. Some methods for connecting electrical contact points (e.g., electrode contacts and terminals) include resistance spot welding (i.e., heating the weld location by directing current through a contact area where there is electrical resistance) and friction wire bonding (e.g., utilizing ultrasonic energy to generate heat and bond materials together). However, it may be difficult to accurately identify and adapt such welding techniques to misaligned connection points. For example, a spot weld may generate enough heat between misaligned connection points to complete the weld, but it may be difficult to assess whether the weld has sufficiently welded the connection points (e.g., for handling high-power loads).

Another welding technique is laser welding, which can achieve markedly higher throughput with substantially lower cost both in operating expenses (OPEX) and capital expenditures (CAPEX) than either of the aforementioned connection methods in high volume manufacturing operations. However, laser welding is much more sensitive to misalignment of the substrate and the heat sink to which it is welded, particularly in the space between the two. For this reason, applying laser welds to a misaligned contact area may either damage surrounding structure from deflection of the laser beam or result in a poor weld that will fail early in service. Thus, improved systems and methods for manufacturing and assembling large-sized battery cell arrays are provided by the embodiments described herein.

In an aspect of some embodiments described herein, a detector is used to scan an electrode contact area for each cell of an array of battery cells for possible weld sites. Based on the scan of each cell, a determination is made of whether each of the possible weld sites is viable. Viability may be determined on the basis of a determined alignment between a connector and cell electrode contact area and, based on the alignment, whether applying the weld in each corresponding possible contact area will result in a weld that sufficiently electrically bonded the electrode contact area and connector.

Based on determining that at least one of the possible weld sites is viable, at least one of the viable weld sites is selected and welded. In some embodiments, a determination is made as to whether a weld of a viable weld site is successful. Utilizing a weld plan based on determining viable weld sites, an additional alternative viable weld site may be selected and welded in response to detecting a failed weld. In some embodiments, the battery array may be re-aligned or discarded in response to a number of welds failing and/or a lack of a number of available viable weld sites.

The detection of viable weld sites may be determined by detecting light produced by either a welding laser operating in a low-power mode or a standard visible-spectrum light shone atop one or many battery cells at an angle of approximately 10 to 45 degrees from the plane of the cell tops. After determining viable weld sites, the success of the weld may be analyzed using light produced and reflected from the laser during the weld. If a poor weld is detected, an alternative viable weld site may be selected and welded.

BRIEF DESCRIPTION OF THE DRAWINGS

The above and other objects and advantages of the disclosure will be apparent upon consideration of the following detailed description, taken in conjunction with the accompanying drawings, in which like reference characters refer to like parts throughout, and in which:

FIG. 4A is an illustrative diagram of an aligned battery cell contact area with determined viable weld sites according to some embodiments of the disclosure;

FIGS. 4B, 4C, and 4D are illustrative diagrams of a misaligned battery cell contact areas with determined viable weld sites according to some embodiments of the disclosure;

FIG. 5A is an illustrative diagram of a computing device used in a welding system according to some embodiments;

FIG. 5B is an illustrative diagram of a laser welding system according to some embodiments;

FIG. 5C shows an illustrative block diagram of processing, vision, and welding circuitry in a welding system according to some embodiments of the disclosure;

DETAILED DESCRIPTION

In an aspect of the disclosure, systems and methods scan an electrode contact area for each cell of an array of battery cells for possible weld sites. Based on the scan of each cell, a determination is made of whether each of the possible weld sites is viable. Viability may be determined on the basis of the alignment between a connector and cell electrode contact area. Based on the alignment, a determination is made about whether applying a weld in each corresponding possible contact area will result in a bond that establishes a sufficient electrical connection between the electrode contact area and connector. Determining and selecting viable weld sites among multiple possible weld sites as described permits a robust, efficient method and system of assembling large arrays of battery cells.

Figure 1:
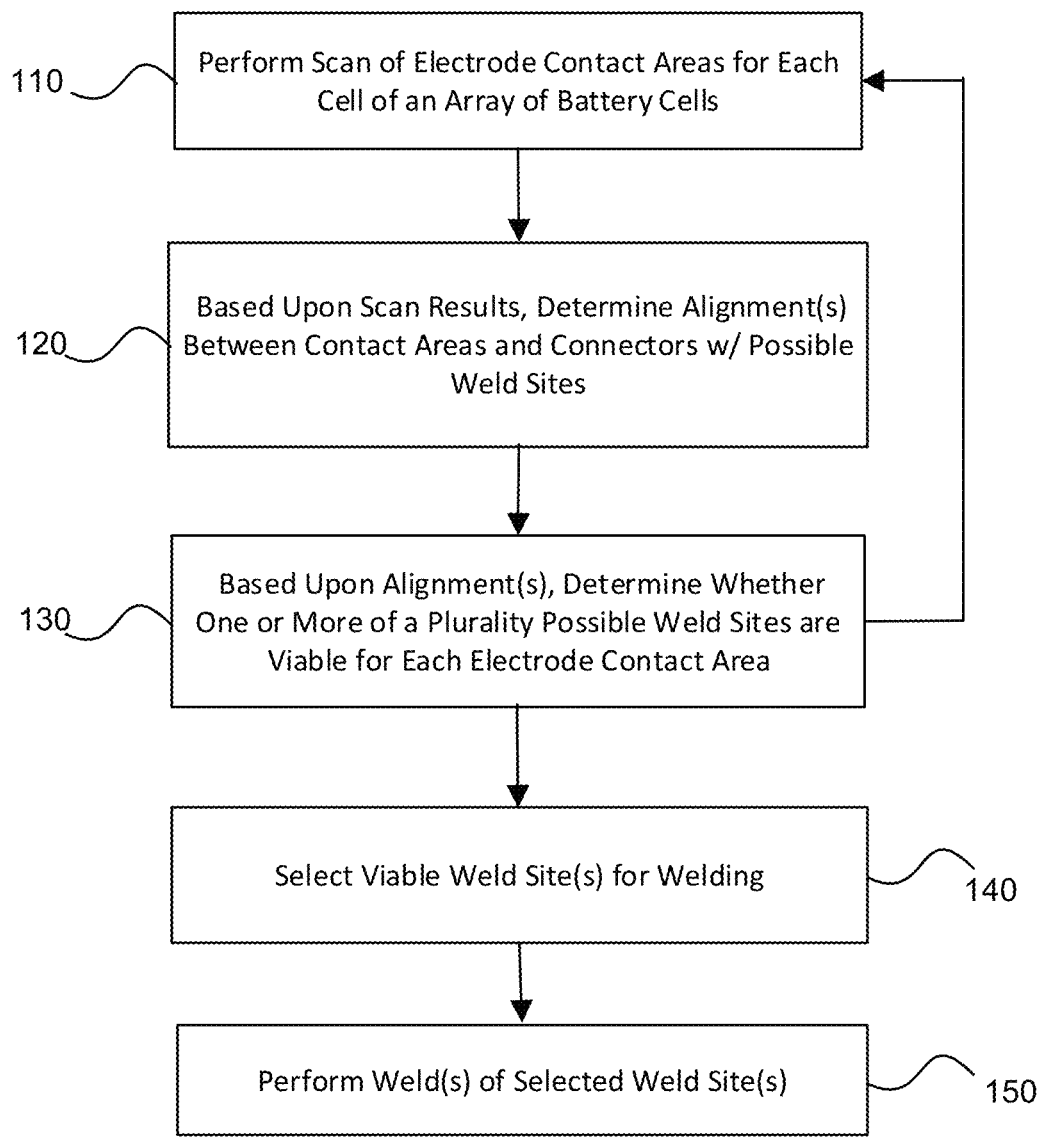
FIG. 1 is an illustrative flowchart of a process for selecting and welding electrode contact areas of an array of battery cells according to some embodiments of the disclosure.

FIG. 1 is an illustrative flowchart of a process for selecting and welding electrode contact areas of an array of battery cells according to some embodiments of the disclosure. At block 110, a scan of electrode contact areas for each cell of the array of battery cells is performed. The scan may be performed using an optical detector. In some embodiments as described herein, the optical detector is used to receive light reflected from different portions of the electrode contact areas. The reflected light may be produced in response to laser illumination of the contact areas. In some embodiments, the laser illumination is generated from a welding laser operating in a low-power mode configured to avoid damaging the contact area.

At block 120, based upon the scans performed at block 110, alignments between the electrode contact areas and connectors to which they may be welded are determined. In some embodiments, the alignments are determined by analyzing the reflected light from the different portions of the electrode contact areas. The different portions may include portions of a contact area and portions of a connector which represent an alignment between weld connection points. The different portions may be represented by different materials or physical characteristics which cause different intensities and/or wavelengths of light to be reflected and received by a detector.

At block 130, based upon the determined alignments, a determination is made of whether one or more of multiple possible weld sites for each electrode contact area are viable for welding. Viability of possible weld sites may be determined based on comparing the determined alignment with divergence from an optimal alignment. For example, certain possible viable weld sites in contact areas that diverge from an optimally aligned contact area may be determined as non-viable based on a divergence from particular vertical and/or horizontal thresholds from an optimal alignment.

At block 140, one or more of the determined viable weld sites are selected for welding. In some embodiments, the viable weld sites for each contact area are organized based upon different contact area portions designated for separate terminals and/or in a particular order of priority or preference. For example, viable weld sites that are more closely centered or aligned with a terminal are assigned a higher preference as primary weld sites. The primary weld sites may be selected for welding first with lower preference/alternate weld sites selected for welding should welding of the higher preference/primary weld sites fail.

At block 150, one or more of the selected weld sites are welded. The selected sites that are welded may initially include one or more of the highest-preference/primary weld sites. In some embodiments, the weld is analyzed to determine whether the weld passes particular criteria for being a successful weld. The analyzing may be based on light received at a detector during the weld. For example, a lack in a certain level of intensity and/or wavelength of light received during the weld is used to indicate a failed weld. In response to detecting a failed weld, the same or one or more additional viable weld sites may be welded until a successful weld is detected.

Figure 2:
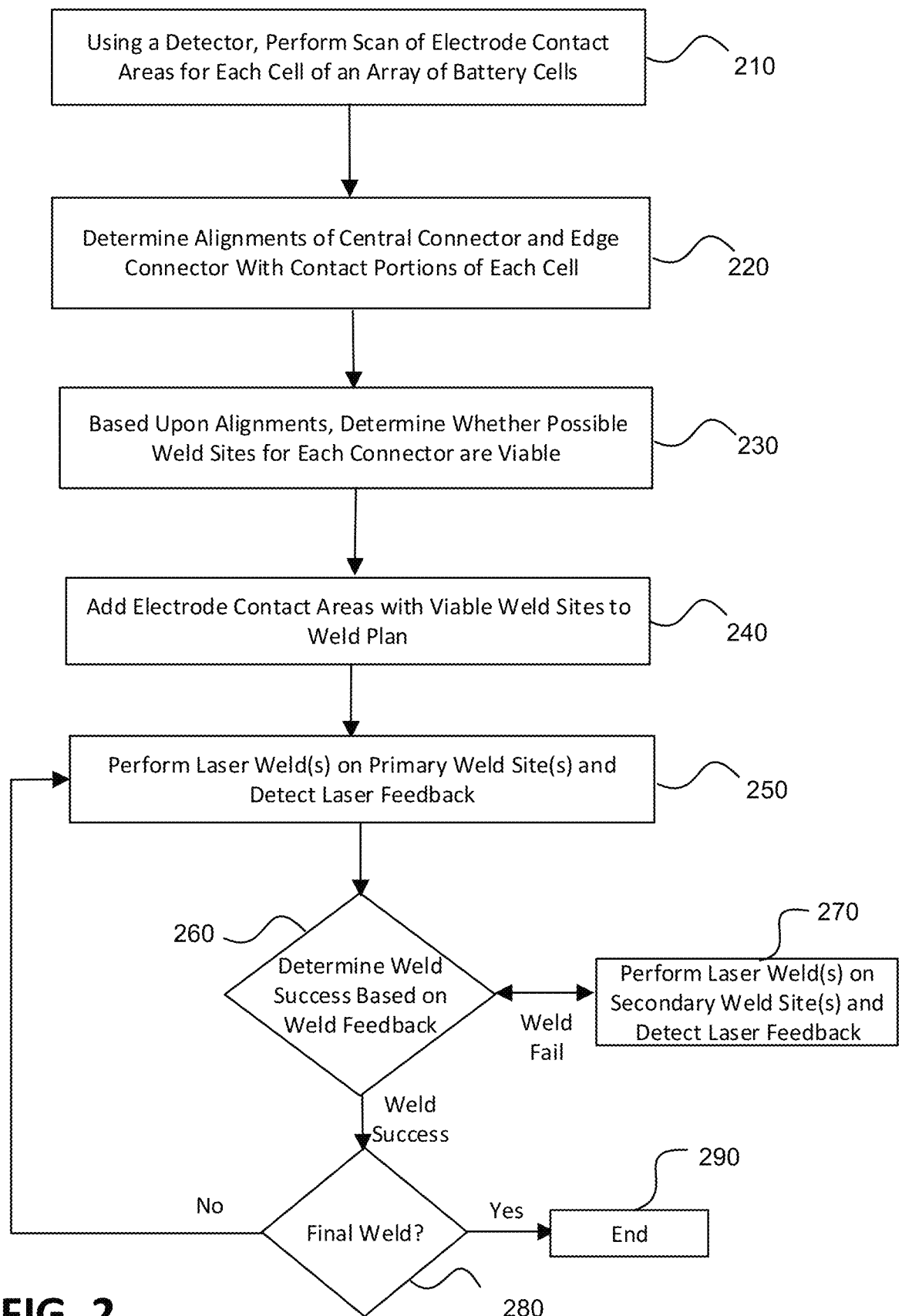
FIG. 2 is an illustrative flowchart of a process for selecting and welding electrode contact areas of an array of battery cells according to some embodiments of the disclosure.

FIG. 2 is an illustrative flowchart of a process for selecting and welding electrode contact areas of an array of battery cells according to some embodiments of the disclosure. At block 210, a detector is used to perform a scan of an electrode contact area for each cell of an array of battery cells. The detector may be a light detector such as a photodetector or similar device that converts light energy into an electrical output. In some embodiments, the detector operates to receive light reflected from areas of the electrode contact area, including contacts and terminals being targeted for welding.

The contact area and detector may be moved with respect to each other in order to detect light from the various portions of the contact area. For example, an actuator may move a detector incrementally over a contact area as the detector receives light signals from the different portions of the contact area. The light detected is used to identify the components of the contact areas from which the light is reflected while the position of the actuator is monitored to determine a corresponding relative position of the identified areas within the contact area. The light reflected may be generated in response to illumination from a predetermined light source such as a welding laser operating in a low-power mode. The identification may be based upon wavelength/intensity light reflection profiles associated with the materials with which the components are manufactured. For example, in some embodiments, the contacts are manufactured with steel or nickel-plated steel and the terminals (e.g., foil tabs) are manufactured with aluminum, each having their respective profiles. The relative positions of these components may be calculated by detecting a transition from one material to another (e.g., by detecting a transition from one profile to another) while an actuator moves a detector over them in predetermined increments.

At block 220, based upon the scan of block 210, alignments are determined for a central connector and an edge connector between corresponding contact portions of each battery cell. The connectors may correspond to negative and positive terminals of a battery cell, for example. Using the relative positions between the connectors and battery cell contacts and/or other portions, an alignment between the components is calculated. For example, the positions may be compared to an optimal alignment (e.g., a relative X/Y coordinate offset between components) where a difference from the optimal alignment is calculated.

At block 230, based on the alignments determined at block 220, possible weld sites within respective contact areas are determined as viable or non-viable. The possible weld sites may include multiple possible weld sites of contact areas corresponding to each of the central connector and edge connector. As discussed further herein, determining viability may be based on the alignment between the contact areas and respective connector. For example, if the deviation from an optimal alignment described above exceeds a predetermined amount, certain possible weld sites may be determined as non-viable without rework first to correct said alignment. Certain possible weld sites may be determined as viable if the deviation from an optimal alignment is within particular thresholds.

At block 240, the weld sites of the electrode contact areas that were determined to be viable at block 230 are added to a weld plan. The weld plan may include a selection of primary viable weld sites to weld and a selection of alternate viable weld sites to weld should a weld of a primary or alternate weld site fail to succeed. As described further herein, primary and alternate weld sites may be determined by their positions within a contact area. For example, weld sites that are most centrally located within a contact area may be selected as a primary weld site and alternate weld sites may be prioritized and ordered based on their proximity to a central location of the contact area.

At block 250, laser welds are performed on the primary weld sites added to the weld plan at block 240. In some embodiments, during the weld, feedback from the laser welding process is received. The feedback may be in the form of light transmitted/reflected and detected from the weld location in response to the welding. At block 260, based on the feedback, a determination is made of whether the weld is successful. In some configurations of terminal connectors and battery contact portions, an unsuccessful weld will be detected as a markedly higher intensity of reflected visible light in the wavelength range of, for example, 600-800 nm resulting from the laser light directly contacting the contact portion of the battery cell (e.g., due to misalignment of the terminal connector over the contact area). It will be noted that an emission of 600-800 nm light will also be observed in successful welds, however, it will be detected at a much lower-intensity due to greater absorption of the laser light into the terminal connector than the contact portion of the battery cell (e.g., due to different properties of the terminal connector and contact portion). Stated another way, a successful weld will result in a lower amount of black body radiation than an unsuccessful weld that completely or partially misses the terminal connector. If a weld is unsuccessful, an available secondary/alternative weld site may be selected for welding at block 270. Based on the selection, a weld of one or more alternative viable weld site(s) is performed while a determination of the weld's success is similarly analyzed. In some embodiments, alternative viable weld site(s) are selected and welded until at least one successful weld is performed for a particular terminal or there are no remaining available viable weld sites. In some embodiments, when a weld fails, all alternative viable weld sites of a contact area are welded such as to avoid a potential imbalance and inconsistent impedance in the respective contact area. In some embodiments, all viable weld sites are welded during an initial (first) pass such as to increase the likelihood of an array not requiring additional reworking.

If a weld is successful at block 260, a determination is made at block 280 of whether additional welds need to be performed or whether a prior weld performed at blocks 250 or 270 was the final weld under the weld plan. If the final weld under the weld plan has been performed, the welding process for the weld plan is ended at block 290. If additional welds are to be performed under the weld plan, the process returns to block 250 to perform the additional welds.

Figure 3:
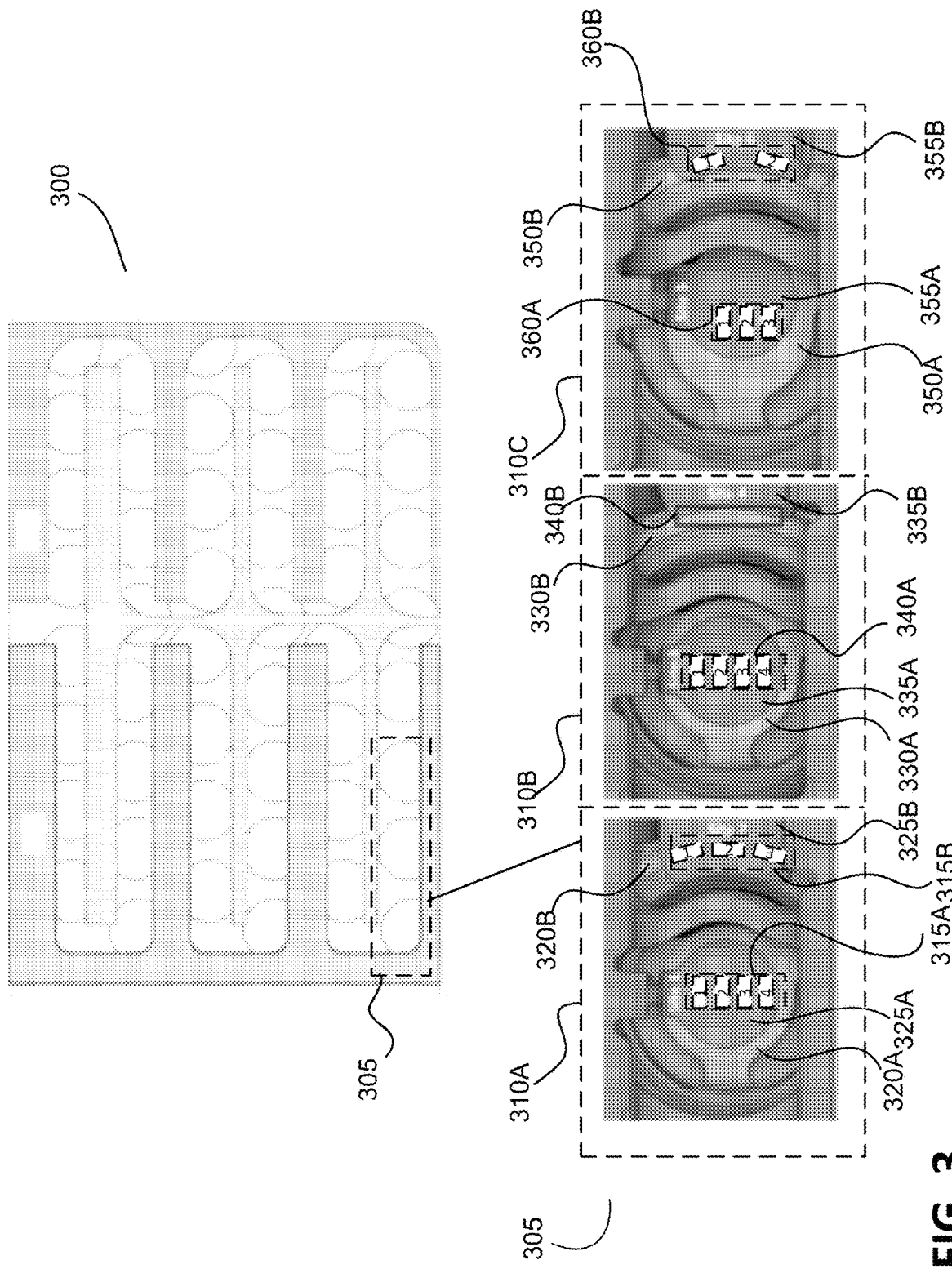
FIG. 3 is an illustrative diagram of an array of battery cells and potential weld sites according to some embodiments of the disclosure.

FIG. 3 is an illustrative diagram of an array of battery cells and potential weld sites according to some embodiments of the disclosure. An array of battery cells 300 includes section 305 having multiple cells and respective electrode contact areas 310A, 310B, and 310C. Each of the contact areas 310A, 310B, and 310C includes two electrode contacts, a centrally located button-shaped contact ("center contact"), 320A, 330A, and 350A, respectively, and an edge contact, 320B, 330B, and 350B, respectively. Contact areas 310A, 310B, and 310C also each include center terminal connectors, 325A, 335A, and 355A for welding to the respective center contact. Edge terminal connectors, 325B, 335B, and 355B, are arranged for welding to the respective edge contact. In some embodiments, the terminal connectors are elements of a current collector assembly (CCA).

Within a site area for each contact, a number of possible weld sites are determined to be viable or not viable such as described herein. For contact 320A and terminal connector 325A, a site region 315A includes four weld sites determined to be viable. For contact 320B and terminal 325B, a site region 315B includes three weld sites determined to be viable. As described herein, the viability of possible weld sites may be determined based on a determined alignment between a contact and connector. The alignment/viability may be based on whether possible weld sites between the contact and connector and are sufficiently within or proximate to central or interior overlapping regions of both the contact and terminals. For example, the viable weld sites of region 315A are within central overlapping regions of contact 320A and terminal connector 325A. Similarly, the viable sites of region 325B are within central overlapping regions of contact 320A and terminal connector 325A. As described herein, these sites may be determined as viable based upon aligning within certain maximum deviations from an optimal alignment between the corresponding contact and terminal connector.

Within contact area 310B, contact 330A is sufficiently aligned with terminal 335A for determining that four possible weld sites are viable in region 340A. For example, the relative positions between contact 330A and terminal 335A are close enough to an optimal alignment so that all four possible weld sites are determined to be viable. On the other hand, contact 330B is not sufficiently aligned with terminal 335B for any possible weld sites to be determined as viable. The amount of overlapping area between contact 330B and terminal 335B is insufficient to implement a sufficient weld for any of possible weld sites in region 340B. In some embodiments, when such misalignments are identified such as described herein, the battery array 300 may be further re-aligned or reworked for reassessment of possible welding sites and thereafter welded subsequent to a successful realignment.

Within contact area 310C, contact 350A and terminal connector 355A are misaligned to an extent where three possible weld sites within region 360A are determined to be viable. Compared to contact areas 310A and 310B, an insufficient amount of overlap is present between the respective contact 350A and connector 355A in region 360A for a fourth possible weld site to be determined as viable. Similarly, compared to contact 320B and connector 325B of contact area 310A, contact 350B and terminal connector 355B are insufficiently aligned/overlapping for a third possible weld site to be viable within region 360B.

FIG. 4A is an illustrative diagram of an aligned battery cell contact area with determined viable weld sites according to some embodiments of the disclosure. The battery cell contact area of FIG. 4A includes a center contact 410 and an edge contact 430 aligned for being welded to connectors 415 and 440, respectively. Viable weld sites 420 are shaped in an arcuate manner which, in some embodiments, represent an outline of the application of a weld to the weld site (e.g., with a laser). The possible weld sites of FIG. 4A are also elongated relative to the possible weld sites of FIG. 3. The elongated weld sites of FIG. 4A may reduce the likelihood that the unwelded portions of the connectors (e.g., connector 415) will separate from the corresponding contact (e.g., contact 410) during subsequent manufacturing steps or during use. Elongated weld sites also reduce the resistance at the joint and increases the mechanical robustness of the weld to long-term shock and vibration loads during use (e.g., in an electrical vehicle application). The arcuate shape also will make it more difficult for the weld to separate from pure peeling from the top of the foil connector 415. For example, some of the welds will be in full shear (those that appear horizontal in the picture) whereas others are at least curved so that it's not straight peel. There are a total of ten possible weld sites 420, 425 over contact 410. The center four weld sites 420 are identified as viable based on a determined centered alignment between center contact 410 and connector 415. The surrounding six weld sites 425 are determined to be non-viable. These additional weld sites are available to accommodate misaligned battery cell contact areas as described further below. A benefit of the shape of the weld sites and the pattern of the weld sites is that there are up to 4 viable weld sites regardless of misalignment (i.e., there can be up to 4 tries to obtain a successful weld), and each weld site has approximately the same weld length. In some embodiments, the possible weld site pattern does not change between battery cells (unlike like the possible weld site patterns of FIG. 3) and viable weld sites are simply selected from the single weld site pattern. This is beneficial because a single hold-down feature, which accommodates all of the possible weld sites, can be used for each battery cell, regardless of which weld site is used. With respect to the edge connector, each of two possible weld sites 420 over contact 430 are determined as viable based on a determined alignment between edge contact 430 and connector 440.

FIGS. 4B, 4C, and 4D are illustrative diagrams of misaligned battery cell contact areas with determined viable weld sites according to some embodiments of the disclosure. Based on alignments between contact areas 410 and respective connectors 415 and between contact areas 430 and respective connectors 440, possible weld sites 420 are determined to be viable while possible weld sites 425 are determined to be non-viable. As shown in FIG. 4B, a misalignment in a vertical direction between contact area 410 and connector 415 results in particular possible arcuate weld sites 425 to be non-viable on account of the arcuate areas falling outside of overlapping portions of the contact area 410 and connector 415. The misalignment may be determined, for example, utilizing methods further described herein.

As shown in FIG. 4C, a determined misalignment in a horizontal direction between contact 410 and connector 415 causes certain possible weld sites 425 for contact 410 to be determined as non-viable. A horizontal misalignment between contact 430 and connector 440 causes one weld site 425 of possible weld sites to fall outside of an overlapping portion between contact 430 and connector 440 and thus be determined as non-viable.

As shown in FIG. 4D, a determined misalignment in an opposite horizontal direction in comparison to FIG. 4C, causes other certain possible weld sites 425 to be determined as non-viable on the relative opposite horizontal end of contact 410. As described herein, determining alignment and viability may be based on scanning portions of a contact and respective connector to determine their relative positions to each other and deviation from an optimal alignment in which an optimal alignment would reflect the center four possible weld sites as being viable such as shown in FIG. 4A.

FIG. 5A is an illustrative diagram of a computing device 518 used in a welding system 500 according to some embodiments. FIG. 5B is an illustrative diagram of a laser welding system 500 according to some embodiments. FIG. 5C shows an illustrative block diagram of processing, vision, and welding circuitry in welding system 500 according to some embodiments of the disclosure. In an embodiment, one or more parts of or the entirety of system 500 may be configured as a system implementing various features, processes, and components of FIGS. 1-4 and 6-7. Although FIGS. 5A-5C show a certain number of components, in various examples, system 500 may include fewer than the illustrated number of components and/or multiples of one or more of the illustrated number of components.

System 500 includes a scanning/welding apparatus 567 configured and arranged to scan and weld an array of battery cells 582 of a battery module 580. Scanning/welding apparatus 567 includes a welding device/circuitry 570 such as a laser welding device for performing welding along a path 572 such as described in some embodiments herein. In some embodiments, the laser could be pulsed neodymium-doped yttrium aluminum garnet (Nd:YAG) or Ytterbium-doped fiber lasers with wavelengths in the range 1060 to 1085 nm as is typical in dissimilar metal laser welding at applied powers between 10 and 30 watts. Scanning/welding apparatus 567 also includes vision circuitry 575 that may be used to perform scans of battery cells 582 from light reflected from the cells 582 such as along an exemplary path 574. The vision circuitry may include a detector such as a photodetector, CCD array, and/or similar device that converts light energy into an electrical output. In some embodiments, the detector operates to receive light reflected from areas of electrode contact areas, including contacts and terminals being targeted for welding. In some embodiments, the vision circuitry 575 and welding circuitry 570 are integrated so that vision circuitry 575 receives light transmissions generated (e.g., reflected/transmitted from an electrode contact area) in response to incident laser emissions from welding laser device/circuitry 570.

A computing device 518 is connected to the welding apparatus 567 which may be programmed with instructions that, when executed using control circuitry 528, cause the execution, in whole or in part, of the scanning/welding processes described herein. Computing device 518 may be programmed with a user interface that accepts input and commands for managing and configuring the scanning/welding processes. A connection 587 between device 518 and scanning/welding apparatus 500 may be through a computer network (e.g., ethernet/wireless). In some embodiments, device 518 is directly integrated (e.g., built-in) with apparatus 567. As illustrated in FIG. 5C, control circuitry 528, vision circuitry 575, and welding device/circuitry 570 are interconnected for performing the scanning/welding processes described herein. For example, control circuitry 528 may cause welding device/circuitry 570 to illuminate/weld an electrode contact area and coordinate vision circuitry 575 to receive contemporaneous transmissions generated in response to the illumination/welding and to forward the detected/received transmission data to control circuitry 528 for analysis and determination of alignment of battery cells.

Computing device 518 includes control circuitry 528, display 534 and input circuitry 516. Control circuitry 528 in turn includes transceiver circuitry 562, storage 538 and processing circuitry 540. In some embodiments, other components of device 518 and system 500 or external connected devices (e.g., servers, network devices, storage devices and others that are not shown) may be configured to implement the features and processes described herein alone or in combination with device 518.

As referred to herein, the phrase "storage," "electronic storage device," or "storage device" should be understood to mean any device for storing electronic data, computer software, or firmware, such as random-access memory, read-only memory, hard drives, optical drives, digital video disc (DVD) recorders, compact disc (CD) recorders, BLU-RAY disc (BD) recorders, BLU-RAY 3D disc recorders, digital video recorders (DVRs, sometimes called personal video recorders, or PVRs), solid state devices, quantum storage devices, or any other suitable fixed or removable storage devices, and/or any combination of the same. Storage 538 may be used to store various types of weld planning data, scan data, weld feedback data, metadata, and/or other types of data. Non-volatile memory may also be used (e.g., to launch a boot-up routine and other instructions in device 518). Cloud-based storage may be used to supplement storage 538 or instead of storage 538. In some embodiments, control circuitry 528 executes instructions for an application stored in memory (e.g., storage 538). Specifically, control circuitry 528 may be instructed by the application to perform the functions and processes discussed herein. In some implementations, any action performed by control circuitry 528 may be based on instructions received from the application. For example, the application may be implemented as software or a set of executable instructions that may be stored in storage 538 and executed by control circuitry 528.

The application may be implemented using any suitable architecture. For example, it may be a stand-alone application wholly implemented on computing device 518. In such an approach, instructions of the application are stored locally (e.g., in storage 538), and data for use by the application is downloaded on a periodic basis (e.g., from a server, an Internet resource, or using another suitable approach). Control circuitry 528 may retrieve instructions for the application from storage 538 and process the instructions to perform the functionality described herein. Based on the processed instructions, control circuitry 528 may determine a type of action to perform in response to input received from input circuitry 516 or from a communication network receiving instructions or data through transceiver circuitry 562. For example, control circuitry 528 may perform the steps in whole or part of processes relative to various embodiments, such as the examples of FIGS. 1-4 and 6-7.

In client/server-based embodiments, control circuitry 528 may include communication circuitry suitable for communicating with an application server or other networks or servers. The instructions for carrying out the functionality described herein may be stored on the application server. Communication circuitry may include a cable modem, an Ethernet card, or a wireless modem for communication with other equipment, or any other suitable communication circuitry. Such communication may involve the Internet or any other suitable communication networks or paths. For example, a remote server may store the instructions for the application in a storage device. The remote server may process the stored instructions using circuitry (e.g., control circuitry 528) and/or generate displays in a computer display of device 585. Computing device 518 may receive inputs from a user via input circuitry 516 and process those inputs in connection with performing the processes described herein It is understood that computing device 518 is not limited to the embodiments and methods shown and described herein. In nonlimiting examples, computing device 518 may be a personal computer (PC), a laptop computer, a handheld computer, a mobile telephone, a smartphone, or any other device, computing equipment, or wireless device, and/or combination of the same capable of suitably operating the described systems and processes.

Control circuitry 528 may be based on any suitable processing circuitry such as processing circuitry 540. As referred to herein, processing circuitry should be understood to mean circuitry based on one or more microprocessors, microcontrollers, digital signal processors, programmable logic devices, field-programmable gate arrays (FPGAs), application-specific integrated circuits (ASICs), etc., and may include a multi-core processor (e.g., dual-core, quad-core, hexa-core, or any suitable number of cores). In some embodiments, processing circuitry may be distributed across multiple separate processors, for example, multiple of the same type of processors (e.g., two Intel Core i9 processors) or multiple different processors (e.g., an Intel Core i7 processor and an Intel Core i9 processor). In some embodiments, control circuitry 528 is configured to implement processes of a weld planning and operation system, or parts thereof, that perform various electrode contact area scanning, weld planning, and welding processes described and shown herein.

Processing circuitry 540 may receive input 504 from input circuit 516. Processing circuitry 540 may convert or translate the received input 504 that may be in the form of user input, digital signals, or analog signals (e.g., generated from vision circuitry 575, welding device/circuitry 570, and/or user input devices) to digital signals. In some embodiments, input circuitry 516 performs a translation of received input to digital signals used in performing the processes described herein.

Transmission of user input or other input 504 to computing device 518 may be accomplished using a wired connection, USB cable, ethernet cable or the like attached to a corresponding input port, or may be accomplished using a wireless connection, such as Bluetooth, WIFI, WiMAX, GSM, UTMS, CDMA, TDMA, 3G, 4G, 4G LTE, or any other suitable wireless transmission protocol. Input circuitry 516 may comprise a physical input port such as a USB port, ethernet port, or any other suitable connection for receiving data over a wired connection, or may comprise a wireless receiver configured to receive data via Bluetooth, WIFI, WiMAX, GSM, UTMS, CDMA, TDMA, 3G, 4G, 4G LTE, or other wireless transmission protocols.

Figure 6:
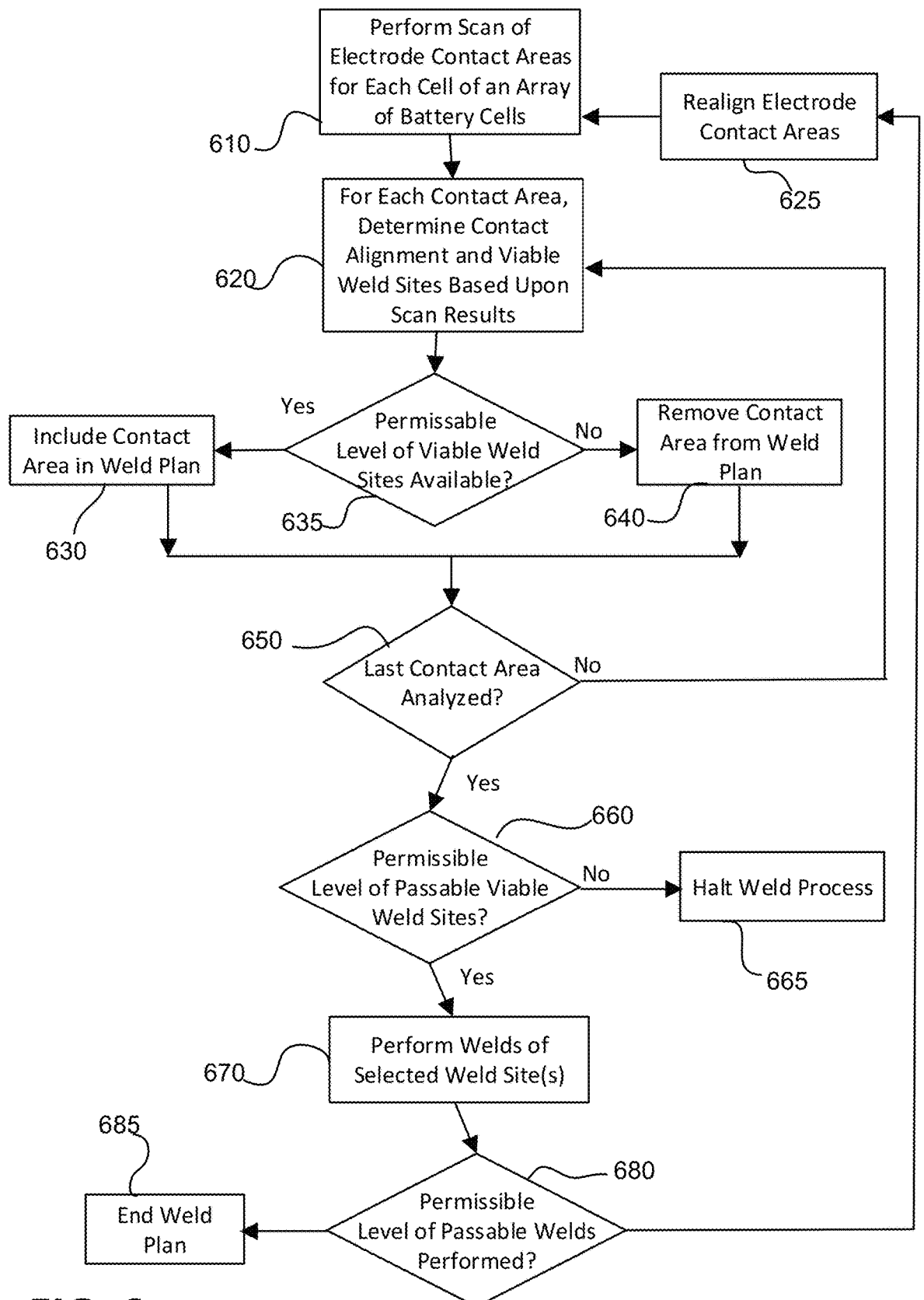
FIG. 6 shows an illustrative flow chart of a process for selecting and laser welding electrode contact areas of an array of battery cells according to some embodiments of the disclosure.

FIG. 6 shows an illustrative flow chart of a process for selecting and laser welding electrode contact areas of an array of battery cells according to some embodiments of the disclosure. At block 610, a scan of electrode contact areas for each cell of an array of battery cells is performed. The scan may be performed, for example, by utilizing a laser, detector, and linear actuator(s) such as further described herein. At block 620, based on the scans of contact areas at block 610, alignments of the contact areas are determined and used to determine the viability of possible weld sites in each contact area.

At block 635, a calculation is made of whether a permissible level of possible weld sites is viable. In some embodiments, a permissible level is based on whether a minimum amount of scanned contact areas include a minimum number of viable weld sites for each of one or more electrode contact/connector pairs in the contact area. For example, a contact area may be determined as inadequately aligned if each electrode contact/connector pair does not have at least one viable weld site.

If a permissible level of viable weld sites are not available, the contact area is removed from a weld plan at block 640. Otherwise, the contact area is included in the weld plan at block 630. As discussed with respect to embodiments herein, viable weld sites included in a weld plan may be prioritized and/or ordered as primary weld sites and alternative weld sites for welding when the weld plan is implemented.

At block 650, a determination is made as to whether the last of the array of contact areas of battery cells has been scanned. If additional contact areas are to be scanned, the process returns to block 620 to scan a next contact area in the array of battery cells. If all of the contact areas designated for scanning in the array have been scanned, a determination is made at block 660 as to whether there is a permissible level of adequately aligned contact areas with viable weld sites. For example, if the number of inadequately aligned contact areas exceeds a predetermined amount, a determination may be made that the weld process should be halted at block 665 and the entire array of scanned cells requires realignment at block 625 or must otherwise be discarded.

At block 670, based on the weld plan, welds of selected viable weld sites are performed. While the welds are performed, a determination is made as to whether the respective welds are successful such as further described herein (e.g., utilizing a detector and analysis of light received in response to a weld). Which welds are successful or not are tracked in memory (e.g., in computing device 518 storage 538 of FIG. 5A) during implementation of the weld plan. At block 680, a determination is made as to whether a permissible level of welds is successful/passable. If a predetermined number of successful welds are not exceeded, the process may proceed to block 625 for realignment of battery cells that were not successfully welded or could not be welded on account of a determined misalignment at block 620. The array of battery cells may also be discarded based on a minimum amount of contact areas not being successfully welded or being misaligned. If the number of successful welds exceeds at least a predetermined amount, a determination is made that the weld plan has been successfully implemented and is ended at block 685.

Figure 7:
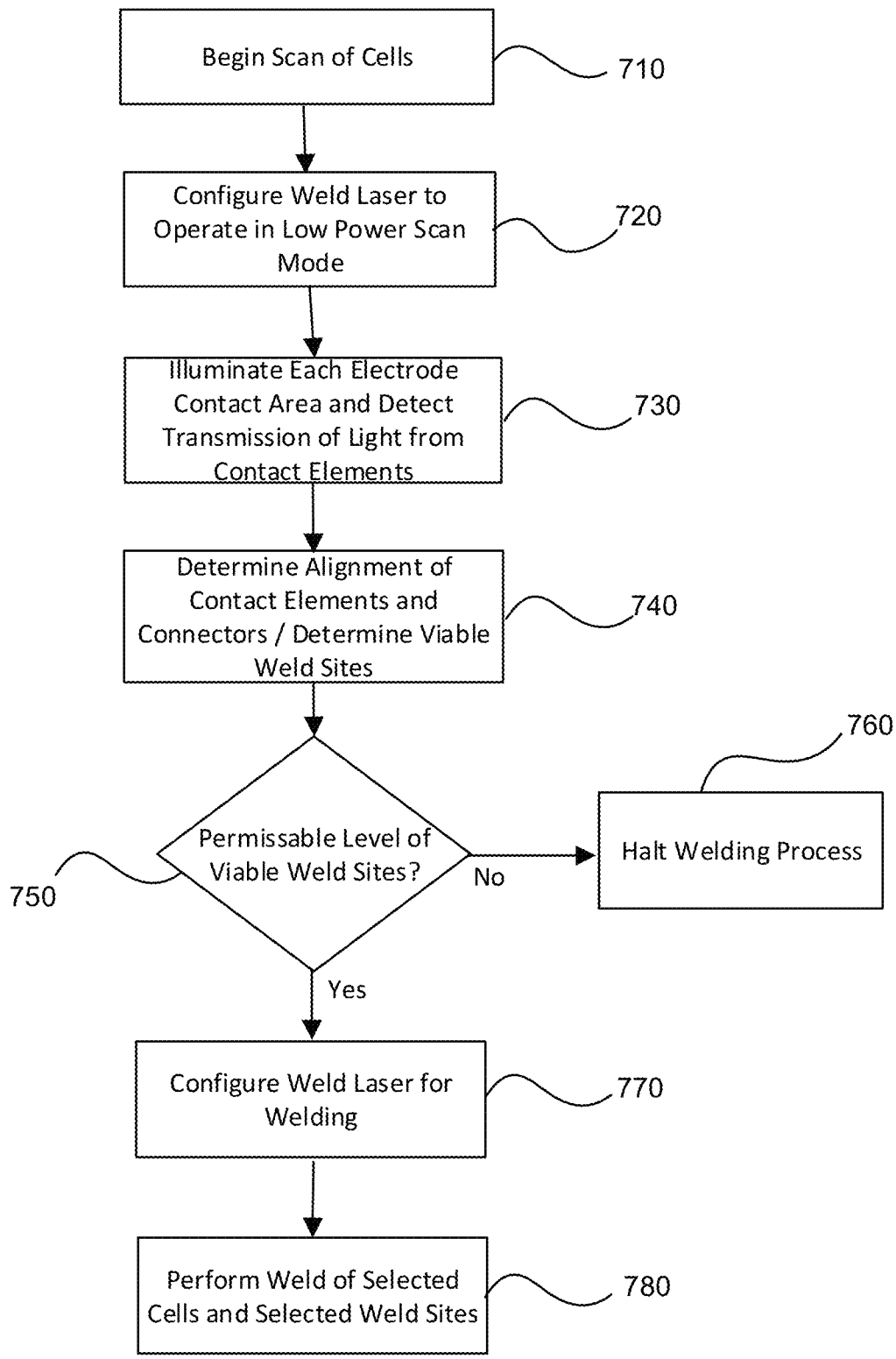
FIG. 7 shows an illustrative flow chart of a process for selecting and laser welding electrode contact areas of an array of battery cells according to some embodiments of the disclosure.

FIG. 7 shows an illustrative flow chart of a process for selecting and laser welding electrode contact areas of an array of battery cells according to some embodiments of the disclosure. At block 710, a process of scanning and welding each of an array of battery cells proceeds. At block 720, a weld laser (e.g., weld laser 570 of FIG. 5B) is configured to operate in a low-power scan mode such as a mode that is configured to avoid damaging or altering the electrode contact area. At block 730, when in the low-power mode, each of the electrode contact areas are illuminated while a detector (e.g., detector 575) receives light reflected from the contact area in response to the illumination. The laser and detector may be positioned over each of the contact areas such as by predetermined incremental movement of the laser/detector and/or array of battery cells as described further herein.

At block 740, based on the scans of respective contact areas, an alignment of contact elements (e.g., each electrode contact and corresponding connector) is determined. Based on the alignments, a determination of the viability of possible weld sites is made of the respective contact areas. At block 750, a further determination is made as to whether a permissible number of battery cells has a minimum number of viable weld sites. For example, if a predetermined number of contact areas cannot be successfully welded based on not having a sufficient number of viable weld sites, the welding process may be halted at block 760. After being halted, the array of battery cells may be further re-aligned before additional welding is performed or the array may otherwise be discarded.

At block 770, when the array of cells includes a sufficient number of viable weld sites, the welding laser is reconfigured from the low-power mode to a higher-power welding mode configured for welding the contact areas. At block 780, welds of viable weld sites such as according to a described weld plan are performed.

The above-described embodiments of the present disclosure are presented for purposes of illustration and not of limitation, and the present disclosure is limited only by the claims which follow. Furthermore, it should be noted that the features and limitations described in any one embodiment may be applied to any other embodiment herein, and flowcharts or examples relating to one embodiment may be combined with any other embodiment in a suitable manner, done in different orders, or done in parallel. In addition, the systems and methods described herein may be performed in real time. It should also be noted, the systems and/or methods described above may be applied to, or used in accordance with, other systems and/or methods.

What is claimed is:

1. A method for welding contacts of a plurality of battery cells, the method comprising:
    using a detector to perform a scan of a cell electrode contact area for each of the plurality of battery cells;
    based upon the scan of each cell electrode contact area, determining whether one or more weld sites of a plurality of possible weld sites for each cell electrode contact area are viable; and
    for each cell electrode contact area, in response to determining that one or more weld sites are viable, selecting and welding at least one of the viable weld sites.

2. The method of claim 1, wherein determining whether one or more weld sites are viable is based upon determining an alignment between a connector and a cell electrode contact within the cell electrode contact area.

3. The method of claim 2, wherein determining the alignment is based upon detecting a difference in light received from the connector and surrounding material.

4. The method of claim 3, wherein the received light is reflected in response to illumination by a laser.

5. The method of claim 4, wherein the welding is performed by the laser, wherein the laser is configured to emit light at a higher power for welding than for determining the alignment.

6. The method of claim 3, wherein the connector comprises an aluminum foil tab and the surrounding material comprises a coated steel cell electrode contact over which the aluminum foil tab is positioned, and wherein the difference in light is based on a difference in light received from the foil tab and the coated steel.

7. The method of claim 3, wherein the connector comprises a current collector assembly having a first portion and a second portion, the first portion arranged for being welded to a button-shaped portion of the electrode contact and the second portion arranged for being welded to a rim portion of the electrode contact, and wherein at least one possible weld site is positioned at the first portion and at least one possible weld site is positioned at the second portion.

8. The method of claim 7, wherein determining the viability of the at least one possible weld site positioned over the first and second portions is based upon a proximity of the at least one possible weld site to a midline of the button-shaped or rim portions, respectively, of the electrode contact.

9. The method of claim 2, wherein the connector is part of a shared connector with which the alignment between each cell electrode contact is determined.

10. The method of claim 1, further comprising:
following the selecting and welding at least one of the viable weld sites:
performing a realignment of the cell electrode contact areas;
using a detector to perform a second scan of a cell electrode contact area for at least one of the plurality of battery cells;
based upon the second scan, determining whether one or more of each cell electrode contact area of the at least one of the plurality of battery cells are viable; and
for each cell electrode contact area of the second scan, in response to determining that one or more weld sites are viable, selecting and welding at least one of the viable weld sites.

11. The method of claim 1, wherein the detector is of a first detector and second detector, the method further comprising:
for each weld, using the second detector to determine whether the weld is passable; and
in response to determining that a weld of a particular cell electrode contact area is not passable, further selecting and welding another viable weld site of the particular cell electrode contact area.

12. The method of claim 11, wherein determining whether a weld is passable comprises using the second detector to detect light received from the contact area in response to welding the welding site with the laser.

13. The method of claim 11, wherein the first detector and second detector are the same detector.

14. A system for welding contacts of a plurality of battery cells, the system comprising:
a welding device comprising a welder;
vision circuitry comprising a detector; and
processing circuitry comprising one or more processors programmed and configured to perform:
causing the vision circuitry and detector to perform a scan of a cell electrode contact area for each of the plurality of battery cells;
based upon the scan of each cell electrode contact area, determining whether one or more weld sites of a plurality of possible weld sites for each cell electrode contact area are viable; and
for each cell electrode contact area, in response to determining that one or more weld sites are viable, selecting at least one of the viable weld sites and causing welding circuitry and the welder to weld the selected at least one viable weld sites.

15. The system of claim 14, wherein determining whether one or more weld sites are viable is based upon determining an alignment between a connector and a cell electrode using the scan performed by the vision circuitry and detector to detect a difference in light received from the connector and surrounding material.

16. The system of claim 15, wherein the welder comprises a welding laser, wherein the received light is reflected in response to illumination by the welding laser, and wherein the welding laser is configured to emit light at a higher power for welding than for determining the alignment.

17. The system of claim 15, wherein the connector comprises a current collector assembly (CCA) having a first portion and second portion, the first portion arranged for being welded to a button-shaped portion of the electrode contact and the second portion arranged for being welded to a rim portion of the electrode contact, and wherein at least one possible weld site is positioned at the first portion and at least one possible weld site is positioned at the second portion.

18. The system of claim 15, wherein the connector is part of a shared connector with which the alignment between each cell electrode contact is determined.

19. The system of claim 14, wherein the one or more processors are programmed and configured to perform:
following the selecting and welding at least one of the viable weld sites:
performing a realignment of the cell electrode contact areas;
using the vision circuitry and detector to perform a second scan of a cell electrode contact area for at least one of the plurality of battery cells;
based upon the second scan, determining whether one or more of each cell electrode contact area of the at least one of the plurality of battery cells are viable; and
for each cell electrode contact area of the second scan, in response to determining that one or more weld sites are viable, selecting at least one of the viable weld sites of the second scan and using the welding circuitry and welder to weld the selected viable weld sites of the second scan.

20. The system of claim 14, wherein the one or more processors are programmed and configured to perform:
for each weld, using the detector to determine whether the weld is passable; and
in response to determining that a weld of a particular cell electrode contact area is not passable, further selecting and welding another viable weld site of the particular cell electrode contact area.

* * * * *